United States Patent [19]

Alexandrov et al.

[11] 4,153,469

[45] May 8, 1979

[54] MONOCRYSTALS BASED ON STABILIZED ZIRCONIUM OR HAFNIUM DIOXIDE AND METHOD OF PRODUCTION THEREOF

[76] Inventors: Vladimir I. Alexandrov, ulitsa Ostrovityanova 31, kv. 291; Vyacheslav V. Osiko, ulitsa Vavilova 48, kv. 63; Vladimir M. Tatarinsev, Leninsky prospekt 45, kv. 112; Viktor T. Udovenchik, ulitsa Bolshaya 135, all of Moscow, U.S.S.R.

[21] Appl. No.: 873,063

[22] Filed: Jan. 27, 1978

Related U.S. Application Data

[63] Continuation of Ser. No. 782,445, Mar. 29, 1977, abandoned, which is a continuation of Ser. No. 391,055, Dec. 27, 1972, abandoned.

[51] Int. Cl.$^2$ .................. C04B 35/48; B01J 17/00; C01F 17/00; C01G 27/02
[52] U.S. Cl. ................... 106/42; 23/293 R; 23/305 RE
[58] Field of Search ............ 106/42; 23/305, 305 RE, 23/293 R

[56] References Cited

U.S. PATENT DOCUMENTS

| | | | |
|---|---|---|---|
| 1,658,659 | 2/1928 | Skaupy et al. | 106/42 |
| 3,259,585 | 7/1966 | Fitch et al. | 106/57 |
| 3,535,481 | 10/1970 | Korb | 106/42 X |
| 3,634,113 | 1/1972 | Fehrenbacker | 106/57 |
| 3,824,302 | 7/1974 | Alexandrov et al. | 106/42 |

FOREIGN PATENT DOCUMENTS 234449  12/1925  United Kingdom ............. 106/42

OTHER PUBLICATIONS

Alexandrov et al., "Physical Properties of Crystal of Hafnium Dioxide and Zirconium Dioxide", Krotk.c Soobshcheniya po Figlike, (11), 1972, pp. 3-7.
Rysbheswitch, E. -Oxide Ceramics, (1960), academic Press, pp. 357, 365-367, 369 & 381.
Kirk-Othmer-Encyclopedia of Chemical Technology, (1963), vol. 10, p. 766, vol. 22, pp. 652-653.

*Primary Examiner*—O. R. Vertiz
*Assistant Examiner*—Mark Bell
*Attorney, Agent, or Firm*—Holman & Stern

[57] ABSTRACT

Monocrystals based on zirconium or hafnium dioxide stabilized with yttrium oxide having the following proportions of the said elements (in mol. %)
 zirconium or hafnium dioxide: 70-90
 yttrium oxide: 30-10.

Said monocrystals may also contain oxides of the transition or the rare-earth elements or their mixtures in an amount of from 0.01 to 5% of the weight of the monocrystal.

The method of producing the monocrystals consists in the preparation of a charge of zirconium or hafnium dioxide and yttrium oxide, melting of the charge, and growing the monocrystals from the obtained melt in the open air by the Stockbarger process.

The obtained monocrystals obtained are transparent, colorless, have a high optical quality (a refractive index of n = 2-2.2; a transmission band of 2,000-74,000 A), a microhardness of 1,300 to 1,500 kg/mn$^2$, a dislocation density of $10^3$ to $10^5$ cm$^{-2}$, and with various dimensions (a height of 1 to 8 cm, and a cross section of 0.5 to 4 cm$^2$).

In order to obtain colored monocrystals, oxides of transition or rare-earth elements are added either to the charge during its preparation or to the melt.

The monocrystals obtained can be used as artificial precious stones in jewelry, in the optical industry, or as laser elements in quantum electronics.

12 Claims, 1 Drawing Figure

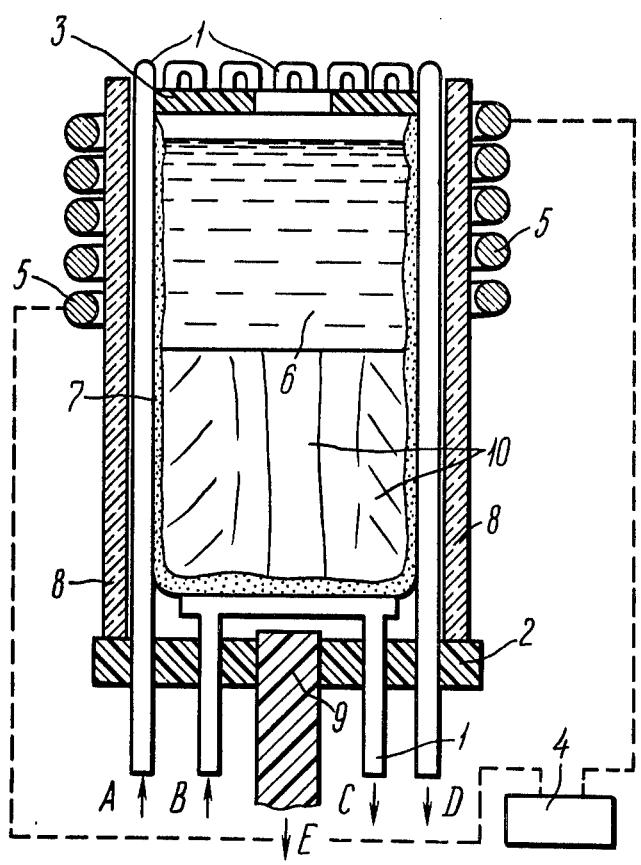

MONOCRYSTALS BASED ON STABILIZED ZIRCONIUM OR HAFNIUM DIOXIDE AND METHOD OF PRODUCTION THEREOF

This is a continuation of application Ser. No. 782,445, filed Mar. 29, 1977, which is now abandoned, and which in turn is continuation of Ser. No. 391,055, filed Dec. 27, 1972 which is now abandoned.

The present invention relates to monocrystals based on stabilized zirconium or hafnium dioxide and to methods of their production.

Said monocrystals can be used as artificial precious stones in jewelry, and as laser elements in optical industry and in quantum electronics.

Monocrystals consisting of zirconium or hafnium dioxide stabilized by calcium oxide are known in the art.

Also known is a method of producing said monocrystals consisting in the preparation of a charge containing zirconium or hafnium dioxide and a stabilizer (calcium oxide), melting of the said charge in a plasma or gas torch and growing the monocrystals from the obtained melt by the Verneuil process.

The monocrystals obtained by the above method finds no practical use since they are small in size and have poor quality. These disadvantages are due to the use of calcium oxide as a stabilizer. Moreover, the method itself does not provide for obtaining monocrystals of a required size and quality due to such adverse factors such as incomplete melting of the charge in the torch, contamination of the monocrystals by the products of the combustion thereof and partially evaporated material of the furnace.

The above method also has a low efficiency.

It is therefore an object of the present invention to produce monocrystals based on stabilized zirconium or hafnium dioxide that would have high quality and dimensions adequate for their practical application.

This, and other objects of the present invention are achieved by that preparing the above said monocrystals which are based on the stablized Zirconium or hafniur dioxide containing yttrium oxide as a stabilizer. The content of said components in the monocrystals is as follows (in mol.%):

zirconium or hafnium dioxide: 70–90
yttrium oxide: 30–10

The proposed monocrystals may be hereinafter referred to as FIANIT which feature high optical quality (refractive index n=2 to 2.2; pass band—2,000 to 74,000 Å), microhardness of from 1300 to 1500 kg/mm$^2$, dislocation density of from $10^3$ to $10^5$ cm$^{-2}$, have various dimensions (1 to 8 cm in height), and a cross section of from 0.5 to 4.0 cm$^2$. These monocrystals are transparent, colorless, and have a cubic structure. As noted above, the monocrystals with such characteristics find wide application.

Monocrystals which are to be used in jewelry as precious stones and in quantum electronics as laser elements should contain, in addition to stabilized zirconium or hafnium dioxide, oxides of the transition or the rare-earth elements mixtures thereof in an amount of 0.01 to 5% of from the weight of the monocrystals.

The ions of transition or rare-earth elements provide for the production of colored monocrystals, while the ions of the rare-earth elements ensure various generation characteristics of the monocrystals employed as laser elements.

Compared to the known artificial precious stones based on corundum (ruby, sapphire, alexandrite, etc.) containing transition metal oxides as colorant additives, the proposed monocrystals have a number of significant advantages, viz.:

(1) a higher refractive index (in the proposed monocrystals n=2–2.2 and this is only slightly lower than that of the diamond, i.e. n=2.4; or of saphire and ruby whose n=1.7); therefore, a higher intensity of brilliance; (2) a wider range of coloring (in addition to the transient metal oxides, the proposed monocrystals may contain oxides of rare-earth elements.

As is known, one of the basic requirements placed on artificial precious stones is high hardness. The hardness of the proposed monocrystals is higher that that of quartz (by a factor of 1.5) and close to that of the monocrystals of the yttrium-aluminium garnet.

The proposed monocrystals can be obtained by a process consisting of preparing charge from zirconium or hafnium dioxide and a stabilizer, melting of the charge, and growing the crystals from the melt obtained. According to the invention, the stabilizer consists of yttrium oxide whose molar ratio to zirconium or hafnium dioxide is from 10–30: 90–70 respectively, in which case the crystals are grown from the molten charge in the open air by the Stockberger process.

In application of the proposed method the use of yttrium oxide as a stabilizer makes it possible to obtain large monocrystals having a high optical quality (high refractive index and wide pass band). Moreover, growing the monocrystals by the Stockbarger process allows for monocrystals of a larger size to be obtained as compared with those obtained by the Verneuil process.

The proposed method of obtaining monocrystals is more efficient when compared with the above prior-art method.

In producing transparent colorless monocrystals, it is recommended that their growth from the melt be effected at a rate of from 2 to 30mm per hour.

As for producing colored monocrystals or those having different generation characteristics, it is advisable to introduce oxides of the transition or rare-earth elements or their mixture in an amount of from 0.01 to 5% of that of the weight of the charge into the latter at the preparation stage or into the melt prior to growing the monocrystals.

The above oxides can also be introduced both into the charge being prepared and into the melt, or by combining the above operations. In this case, the total quantity of the oxides introduced into the charge is from 0.01 to 5% of the charge weight.

Upon the colored monocrystals, it is recommended that they be grown at a rate of from 2 to 10 mm per hour.

The proposed method of producing monocrystals based on zirconium or hafnium dioxide and stabilized with yttrium oxide is effected as follows.

Zirconium or hafnium dioxide is mixed with yttrium oxide at a molor ratio of 70–90:30–10 respectively. These components of the charge can be used both as powders and as molten lump material. The prepared charge is placed into a container which is then melted. The charge is melted by using various heating sources: i.e., high frequency electric field, laser radiation, solor ovens or a plasma or gas torch.

The transparent colorless monocrystals are grown from the melt in the open air by the Stockbarger process. For this process, the container with the melt is to be withdrawn from the charge melting zone at a definite speed, preferably from 2 to 30 mm per hour. As the container is being removed from the melting zone, the melt crystallizes in the form of monocrystalline lumps. These lumps can then be easily disintegrated into separate monocrystals.

The monocrystals thus obtained have a high refractive index, a wide pass band, high microhardness, and the dimensions necessary for their practical application.

As mentioned above, in order to obtain monocrystals having different colors and variable generation characteristics, oxides of transition or rare-earth elements or their mixtures used in an amount of from 0.01 to 5 % of the weight of the charge are added into the latter either during the preparation of the charge or into the melt before growing the monocrystals. Furthermore, the said oxides can be fed in combination during the preparation of the charge and into the melt. Oxides of iron, cobalt, nickel, vanadium, neodymium, praseodynium, europium, holmium, etc. can be used as the oxides of the transition and rareearth elements employed in the process of preparing the colored monocrystals. The above oxides can be used as powders or as molten lump material.

As noted above, it is preferable to produce colored monocrystals by growing them from the melt at a rate of from 2 to 10 mm per hour.

Of the above methods for producing the monocrystals the most expedient one is that effected by means of the apparatus shown in the appended drawing.

According to the drawing, the charge consisting of zirconium or hafnium dioxide and yttrium oxide is melted in a container. The container comprises an assembly having copper water-cooled tubes 1. The bottom of the container consists of an assembly of similar tubes. The entire set of tubes is mounted on a plate 2 made of an electroinsulating material, for example polytetrafluorethylene. The tubes are mounted with a small air gap (1–2 mm) therebetween. The inlet into the tubes is effected along the arrows A and B, while the outlet is effected along the arrows C and D.

Before melting the charge substitute in the container, a local additional charge of metallic yttrium, zirconium or hafnium on an amount of 2 to 5 may also be included. In this case, when the charge is based on zirconium dioxide, metallic yttrium or zirconium is preferably added therein, while in case of using a charge based on hafnium dioxide, metallic yttrium or hafnium is preferably added to the charge. These additives are added to the charge in order to effects its initial melting. Said additives are transformed into their respective oxides in the process of melting the charge.

The composition of the charge before or after introducing the metallic additive is adjusted with a due allowance for the type and amount of the additive to be introduced. The adjustment of the charge composition allows for the preserving of the above percentage of the initial components in the obtained monocrystals.

The charge in the container prepared for melting is shielded with a disk 3 pressed form zirconium or hafnium dioxide stabilized with yttrium oxide, and provided with a central opening. The composition of the disk and that of the charge to be melted should be identical. The said disk is intended for reducing the heat losses during the melting of the charge and when growing monocrystals.

The charge in the container is melted by means of a high-frequency electric field, while the container is cooled by water fed through the tubes 1. A high-frequency oscillator 4 with an oscillation frequency of at least 1 MHz serves as a power source. The energy of the high-frequency oscillations of the oscillator is fed to and induction coil 5 which is then partially absorbed by the additive of metallic yttrium, zirconium or hafnium locally which is placed into the charge. Under the action of local heating, part of the charge contacting the metallic additive is melted (initial melting of the charge). The molten part of the charge absorbs the energy of the high-frequency oscillations of the oscillator, and the melting zone continues to increase in the course of time. As a result, a melt 6 of charge and a crust 7 1.5-2 mm thick are formed in the container. The crust is formed from the unmolten part of the charge contacting the walls and the bottom of the container.

In order to eliminate possible electric breakdowns between the induction coil and the container, the latter is placed in a hollow cylinder 8 of around quartz glass having a wall thickness of 2–3 mm and mounted on the plate 2.

Transparent colorless monocrystals are grown from the melt obtained in the open air by the Stockbarger process. For this purpose, the container is withdrawn from the melting zone at a definite speed, preferably from 2–30 mm per hour while cooling the container by water during the entire process of crystallization. The withdrawal of the container is effected in the direction of the arrow E by means of a rod 9 connected to the plate 2. As the container is withdrawn from the melting zone, the input power of the oscillator is being reduced at a rate providing for a constant temperature at the surface of the melt in the container. The melt is crystallized in the form of monocrystalline lumps 10 whose direction of growth coincides with that of the crystallographic direction (111).

After the process of crystallization is complete, the oscillator is switched off. The monocrystalline lumps obtained are held in the water-cooled container in order to be cooled down to a temperature of no more than 98° C. Thereafter, the lumps are discharged from the container, cooled in the open air, and disintegrated into separate monocrystals.

The above-described process apparatus can also be used for producing monocrystals having different colors and also having different generation properties for their use as laser elements in quantum electronics. For this purpose, as noted above, oxides of transition or rare-earth elements, or their mixtures are added to the charge during its preparation or to the melt prior to growing the monocrystals. These methods of addition for said oxides may be combined.

In producing the colored monocrystals, their growing rate is preferably effected at from 2 to 10 mm per hour. The above-described apparatus for producing monocrystals can be placed into a screening metal housing (not shown) with a water cooling jacket to eliminate the influence of heat and the high-frequency electric field on the operator.

For a better understanding of this invention, given below are some examples for producing the monocrystals based on zirconium or hafnium dioxide stabilized with yttrium oxide by means of the above described apparatus.

EXAMPLE 1

A charge was prepared by mixing 1,108.8 g. of powdery zirconium dioxide and 225.8 g of powdery yttrium oxide (the molar ratio of the zirconium dioxide to the yttrium oxide was 90:10). The prepared charge was loaded into a container. The container was made as an assembly of water-cooled copper tubes having an outer diameter of 6 mm and a wall thickness of 1 mm. The container had the following internal dimensions: diameter d=50 mm and height h=100 mm.

2 g of powdery metallic yttrium were added to the charge before local melting (to provide for the initial melting of the charge). The composition of the charge was adjusted by adding thereto 12.4 g of zirconium dioxide.

The charge was melted in a high-frequency electric field with simultaneous cooling of the container by water fed through the above said tubes. A high-frequency oscillator having an input power of 30 KW and an oscillation frequency of 5.28 MHz was employed as the source of electric energy. After melting the change completely, the surface temperature of the melt was 2,800° C.

The melt obtained was used for growing monocrystals in the open air by the Stockbarger process. For this purpose, the container with the melt was withdrawn from the melting zone at a speed of 2 mm per hour with simultaneous cooling of the container by the cooling water during the whole process of crystallization.

As the container was withdrawn from the melting zone, the input power of the oscillator was being reduced at a rate providing for a constant surface temperature of the melt in the container. The melt was crystallized in the form of monocrystalline lumps.

After the process of crystallization was over, the oscillator was switched off. The monocrystalline lumps obtained were held in the water-cooled container for cooling, to a temperature of 90° C. The lumps were then discharged from the container, cooled in the air to a temperature of 25° C. and divided into separate monocrystals.

The monocrystals thus obtained were transparent and colorless. They had a cross section of 0.5 to 1 cm$^2$, a height of 1 to 3.5 cm, a refractive index of n=2.1, a transmission band of 2,000 to 74,000 Å, a dislocation density of $10^3$ cm$^{-2}$, and a microhardness of 1,300 kg/mm$^2$ (the microhardness of the monocrystals was determined by the Vickers' method by pressing a diamond pyramid into the monocrystal being investigated).

The yield of monocrystals of this size was 50% of that of the weight of the charge.

EXAMPLE 2

A charge was prepared by mixing 1,894.5 g of powdery hafnium dioxide with 225.8 g of powdery yttrium oxide (the molar ratio of the hafnium dioxide to the yttrium oxide was 90:10). The prepared charge was placed into a container. The container was made of an assembly of water-cooled copper tubes having an outer diameter of 6 mm and a wall thickness of 1 mm. The container had the following inner dimensions: diameter d=70 mm and height h=140 mm.

Before melting the charge, 5 g of powdery metallic yttrium were added locally thereto. In order to adjust the composition of the charge, 53.5 g of hafnium dioxide were added thereto The charge was melted similarly to the process described in Example 1, with the only difference being that the high-frequency oscillator had an input power of 40 KW. After the complete melting of the charge, the temperature of the surface of the melt was 2,850° C.

The monocrystalline lumps obtained from this melt were identical with those described in Example 1, with the difference being that the speed of withdrawal of the container from the melting zone was 30 mm per hour. The crystals then treated using the same operations as described in Example 1.

The obtained monocrystals were transparent and colorless. They had a cross section of from 1 to 1.5 cm$^2$, a height of from 1 to 3 cm, a refractive index n=2.0, a transmission band of 2,000 to 74,000 Å, a dislocation density of from $10^5$ cm$^{-2}$, and a microhardness of 1,300 kg/mm$^2$.

The yield of monocrystals of the above size was equal to 30% of that of the charge weight.

EXAMPLE 3

A charge was prepared by mixing 862.4 g of powder zirconium dioxide, 677.4 of powdery yttrium oxide, and 12.3 g of powdery ferric oxide $Fe_2O_3$ (the molar ratio of the zirconium dioxide to the yttrium oxide was 70:30). The prepared charge was loaded into a container. The container was made in the form of an assembly of watercooled copper tubes having an outer diameter of 6 mm and a wall thickness of 1 mm. The internal dimensions of the container were as follows: diameter d=100 and height h=210 mm.

Before melting, 2 g of powdery metallic zirconium were added locally to the charge. In adjusting the charge composition, 2.2 g of yttrium oxide were additionally added thereto.

The charge was melted as described in Example 1, except for the fact that the high-frequency oscillator had an input power of 35 KW. After the complete melting of the charge, the temperature of its surface was 2,900° C.

The monocrystalline lumps were grown from the melt obtained in the procedure of Example 1 with the difference billing that the speed of withdrawal of the container from the melting zone was in this case, 10 mm per hour. The use carried out as described in Example 1.

The obtained monocrystals were yellowish in color. They had a cross section of from 2 to 4 cm$^2$, a height of from 1 to 2.5 cm, a refractive index n=2.2, a dislocation density of $10^5$ cm$^{-2}$, and a microhardness of 1,400 kg/mm$^2$.

The yield of the monocrystals of the above size was 45% of that of the weight of the charge.

Colored monocrystals were obtained in a similar way by using oxides of other transition elements. Given in Table 1 are the quantities of the oxides utilized and the colors of the monocrystals obtained.

Table 1

| Oxide | Quantity of oxide, in per cent of the total weight of zirconium dioxide and yttrium oxide | Color of obtained monocrystals |
| --- | --- | --- |
| $Co_2O_5$ | 0.01 to 0.5 | dark lilac |
| NiO | 0.1 to 2.0 | light brown |
| $TiO_2$ | 0.1 to 2.0 | yellow-brown |
| $V_2O_3$ | 0.1 to 1.0 | greenish |
| $Cr_2O_3$ | 0.1 to 1.0 | olive |
| $MnO_2$ | 0.1 to 1.0 | brown-violet |
| CuO | 0.1 to 2.0 | yellowish |

All the other characteristics of the monocrystals were indentical to those of the monocrystals containing ferric oxide given above.

EXAMPLE 4

A charge was prepared by mixing 1,473 g of powdery hafnium dioxide and 677.4 g of powdery yttrium oxide (the molar ratio of the hafnium dioxide to the yttrium oxide was equal to 70 : 30). The prepared charge was loaded into the container having the dimensions the given in Example 3.

5 g of powdery metallic yttrium were locally added to the charge before melting. In order to adjust the composition of the charge, 14.3 g of hafnium dioxides.

The charge was melted in the manner as described in Example 1 by using a high-frequency oscillator having an input power of 40 KW. After the charge was melted completely, the temperature of the surface of the melt was equal to 2,800° C. 29g of N:O powder were added to the obtained melt. Then, monocrystalline lumps were grown from the melt with he subsequent operations being effected in the way as described in Example 1.

The obtained monocrystals were light-brown in color. They had a cross section of from 2 to 4 cm$^2$, a height of from 1 to 1.5 cm, a refractive index n=2.0, a dislocation density of $10^3$ cm$^{-2}$ and a microhardness of 1,500 kg/cm$^2$.

The yield of the monocrystals having said dimensions was 40% of that of the weight of the charge.

In a similar way, there colored monocrystals were obtained with the use of oxides of other transition elements. Give in Table 2 the the quantities of utilized oxides the utilized and the colors of the monocrystals obtained.

Table 2

| Oxide | Quantity of oxide, in per cent of the total weight of hafnium dioxide and yttrium oxide | Color of obtained monocrystals |
|---|---|---|
| $Fe_2O_3$ | 0.1 to 0.8 | yellowish |
| $Co_2O_3$ | 0.01 to 0.5 | dark lilac |
| $TiO_2$ | 0.1 to 2.0 | yellow-brown |
| $V_2O_3$ | 0.1 to 1.0 | greenish |
| $Cr_2O_3$ | 0.1 to 1.0 | olive |
| $MnO_2$ | 0.1 to 1.0 | brown-violet |
| $CuO$ | 0.1 to 2.0 | yellowish |

All the other characteristics of the monocrystals were identical to those of the monocrystals containing nickel oxide given above.

EXAMPLE 5

A charge was prepared by mixing 168 of powdery hafnium dioxide, 451.6 g of powdery yttrium oxide, and 63.9 g of powdery neodymium oxide $Nd_2O_3$ (the molar ratio of the hafnium dioxide to the yttrium oxide was equal to 80:20). The prepared charge was loaded into a container having the dimensions as given in Example 3.

Before melting the charge, 5 g of powdery metallic hafnium were locally introduced therein. As for adjusting the composition of the charge, 1.5 g of yttrium oxide were added thereto.

The charge was melted as described in Example 1 by using a high-frequency oscillator having an input power of 40 KW. After the complete melting of the charge, the temperature of the surface of the melt was 2,800° C.

Monocrystalline lumps were grown from the thus obtained melt by the procedure as described in Example 1 with the difference being the speed of withdrawal of the container from the melting zone which, in this case, was 5 mm per hour. The subsequent operations performed were identical to those described in Example 1.

The obtained monocrystals were lilac in color. They had across section of from 1.5 to 2 cm$^2$, a height of 1 cm, a refractive index n=2.0, a dislocation density of $10^4$ cm$^{-2}$ and a microhardness of 1,500 kg/mm$^2$.

The yield of monocrystals of the above size was 45% of that of the weight of the charge.

In a similar way, colored monocrystals were obtained with the use of other rare-earth elements. The amount of the oxides used and the colors of the obtained monocrystals are given below in Table 3.

Table 3

| Oxide | Quantity of the oxide, in per cent of the total weight of hafnium dioxide and yttrium oxide | Color of the obtained monocrystals |
|---|---|---|
| $CeO_2$ | 0.1 to 2.0 | yellow-orange |
| $Ce_2O_3$ | 0.1 to 2.0 | bright-red |
| $Pr_2O_3$ | 0.1 to 2.0 | amber |
| $Bu_2O_3$ | 1.0 to 3.0 | pink-cream |
| $Ho_2O_3$ | 0.1 to 5.0 | yellow-green |
| $Br_2O_3$ | 0.01 to 5.0 | pink |
| $Tm_2O_3$ | 1.0 to 5.0 | light green |

The other characteristics of the monocrystals are similar to those of monocrystals containing neodymium oxide given above.

EXAMPLE 6

A charge was prepared by mixing 4,928 g of powdery zirconium dioxide and 2,258 g of powdery yttrium oxide (the molar ratio of the zirconium dioxide to the yttrium oxide was equal to 80:20). The prepared charge was loaded into a container with the dimensions given in Example 3.

Before melting the charge, 4 g of powdery metallic yttrium were introduced therein.

The charge was melted in the way described in Example 1 by using a high-frequency oscillator with an input power of 50 KW. After the charge had been melted completely, the temperature of the melt surface was equal to 2,850° C. 72.8 g of powdery europeum oxide $Eu_2O_3$ were introduced into the obtained melt. Monocrystalline lumps were then grown from the melt as described in Example 1 at a speed of withdrawal of the container from the melting zone equal to 8 mm per hour. Then there were effected the operations described in Example 1.

The obtained monocrystals were pink-cream in color. They had a cross-section of 2 to 4 cm$^2$, a height of 3 to 8 cm, a refractive index n=2.2, a dislocation density of $10^4$ cm$^{-2}$ and a microhardness of 1,400 kg/mm$^2$.

The yield of monocrystals of this size was 35% of the weight of the charge.

In a similar way, there were obtained colored monocrystals with the use of oxides of other rare-earth elements. Quantities of oxides used and colors of the obtained monocrystals are given in Table 4.

Table 4

| Oxide | Quantity of oxide, in per cent of the total weight of zirconium dioxide and hafnium oxide | Color of the obtained monocrystals |
|---|---|---|
| $CeO_2$ | 0.1 to 2.0 | yellow-orange |
| $Ce_2O_3$ | 0.1 to 2.0 | bright red |

Table 4-continued

| Oxide | Quantity of oxide, in per cent of the total weight of zirconium dioxide and hafnium oxide | Color of the obtained monocrystals |
|---|---|---|
| $Nd_2O_3$ | 0.01 to 3.0 | lilac |
| $Pr_2O_3$ | 0.1 to 2.0 | amber |
| $Ho_2O_3$ | 0.1 to 5.0 | yellow-green |
| $Br_2O_3$ | 0.01 to 5.0 | pink |
| $Tu_2O_3$ | 1.0 to 5.0 | light green |

The other characteristics of the monocrystals are identical to those given above for monocrystals containing europeum oxide.

EXAMPLE 7

A charge was prepared by loading a container with 4,928 g of zirconium dioxide in the form of molten lump material, 2,258 g of yttrium dioxide in the same form, 35.9 g of cobalt oxide $Co_2O_3$, and 35.9 g of neodymium oxide $Nd_2O_3$ (the molar ratio of the zirconium dioxide to the yttrium oxide was equal to 80:20). The container had the dimensions as given in Example 3.

Before melting, 2.5 g of metallic yttrium were introduced locally into this charge. In order to adjust the composition of the charge, 7 g of zirconium dioxide.

The charge was melted as described in Example 1 by using a high-frequency oscillator having an input power of 50 KW.

After the charge had been melted completely, the temperature of the melt surface was 2,800° C.

Monocrystalline lumps were grown from the obtained melt as described in Example 1 at a speed of withdrawal of the container from the melting zone equal to 3 mm per hour. Then, there were the operations proceeded as in Example 1 from these.

The obtained monocrystals were dark lilac in color. They had a cross section of from 1 to 3.5 cm², a height of from 4 to 7 cm, a refractive index n=2.1, a dislocation density of $10^5$ cm$^{-2}$, and a microhardness of 1,400 kg/mm².

The yield of the monocrystals of this size was 40% of that of the weight of the charge.

EXAMPLE 8

A charge was prepared by mixing 4,928 g of powdery zirconium dioxide, 2,258 g of powdery yttrium oxide, and 71.8 g of powdery holnium oxide $Ho_2O_3$ (the molar ratio of the zirconium dioxide to the yttrium oxide was equal to 80:20). The prepared charge was loaded into a container having the dimensions as given in Example 3.

Before melting the charge, 5 g of powdery metallic yttrium were locally introduced therein. As for adjusting the composition of the charge, were 14 g of zirconium dioxide were added thereto.

The charge was melted as described in Example 1 by means of a high-frequency oscillator having an input power of 40 KW. After the charge had been melted completely, the temperature of the melt surface was 2,850° C. 71.8 g of powdery european oxide $Eu_2O_3$ were added to the obtained melt. The, monocrystalline lumps were then grown from the melt as described in Example 1 as a speed of withdrawal of the container from the melting zone equal to 6 mm per hour. The subsequent operations were identical to those as described in Example 1.

The obtained monocrystalline were light pink in color. They had a cross section of from 2 to 4 cm², a height of from 2 to 6 cm, a refractive index n=2.2, a dislocation density of $10^4$ cm$^{-2}$, and a microhardness of 1,500 kg/mm².

The yield of monocrystals of this size was 50% of that of the weight of the charge.

What is claimed is:

1. Transparent, cubic monocrystals consisting essentially of a metal dioxide selected from the group consisting of zirconium and hafnium, stabilized with yttrium oxide, with the following composition of said components (in mol. %):
   metal oxide: 70-90
   yttrium oxide: 30-10;
with said monocrystals exhibiting the following characteristics:
   a refractive index of n=from 2 to 2.2, and
   a pass band from 2,000 to 74,000 Å;
   a microhardness of from 1,300 to 1,500 kg/mm²;
   a dislocation density of from $10^3$ to $10^5$ cm$^{-2}$; and
   dimensions of from 1.0 to 8.0 cm in length, and from 0.5 to 4.0 cm in cross-section.

2. Transparent, cubic monocrystals as claimed in claim 1, which also contain oxides of elements selected from the group consisting of transition and rare-earth elements, and taken in an amount of from 0.01 to 5% of the weight of the monocrystal.

3. A method of producing transparent, cubic monocrystals based on a dioxide of a metal selected from the group consisting of zirconium and hafnium, said dioxide being stabilized with yttrium oxide; comprising the steps of preparing a charge of said dioxide of a metal selected from the group consisting of zirconium and hafnium, and yttrium oxide in a molar ratio of said metal dioxide to yttrium oxide from 70–90:30–10 respectively; heating said charge to a temperature sufficient to effect melting thereof; and growing the monocrystals from the melt obtained in the open air by withdrawing said charge from the melting zone at a rate of from 2 to 30 mm per hour.

4. A method as claimed in claim 3, wherein said temperature to which said charge is heated to effect melting thereof is within the range of 2800-2900° C.

5. A method as claimed in claim 3, whereby oxides of elements selected from the group consisting of transition and rare-earth elements are added to the charge during the preparation in an amount of from 0.01 to 5% of the weight of the charge.

6. A method as claimed in claim 3, whereby oxides of elements selected from the group consisting of transition and rare-earth elements are added to the melt prior to growing the monocrystals in an amount of from 0.01 to 5% of the weight of the charge.

7. A method as claimed in claim 3, whereby additional oxides of elements are added to the charge during its preparation and to the melt prior to growing the monocrystals, said additional oxides of elements being selected from the group consisting of the transition and the rare-earth elements, in which case the total amount of the oxides added is from 0.01 to 5% of that of the weight of the charge.

8. A method as claimed in claim 5, whereby the monocrystals are grown at a rate of from 2 to 10 mm per hour.

9. A method as claimed in claim 6, whereby the monocrystals are grown at a rate of from 2 to 10 mm per hour.

10. A method as claimed in claim 7, whereby the monocrystals are grown at a rate of from 2 to 10 mm per hour.

11. Transparent, cubic monocrystals produced in accordance with the method as claimed in claim 3.

12. Transparent, cubic monocrystals produced in accordance with the method as claimed in claim 4.

* * * * *

Disclaimer and Dedication 4,153,469.—*Vladimir I. Alexandrov, Vyacheslav V. Osiko, Vladimir M. Tatarinsev* and *Viktor T. Udovenchik,* Moscow, U.S.S.R. MONOCRYSTALS BASED ON STABILIZED ZIRCONIUM OR HAFNIUM DIOXIDE AND METHOD OF PRODUCTION THEREOF. Patent dated May 8, 1979. Disclaimer and Dedication filed May 18, 1983, by the assignee, *Vsesojuznoje Objedinenije "Licensintorg".*

Hereby disclaims and dedicates the remaining term of said patent.

[*Official Gazette September 6, 1983.*]

REEXAMINATION CERTIFICATE (205th)

United States Patent [19]
Alexandrov et al.

[11] B1 4,153,469
[45] Certificate Issued Jun. 5, 1984

[54] MONOCRYSTALS BASED ON STABILIZED ZIRCONIUM OR HAFNIUM DIOXIDE AND METHOD OF PRODUCTION THEREOF

[75] Inventors: Vladimir I. Alexandrov; Vyacheslav V. Osiko; Vladimir M. Tatarinsev; Viktor T. Udovenchik, all of Moscow, U.S.S.R.

[73] Assignee: Vsesojuznoje Objedinenije "Licensintorg", Moscow, U.S.S.R.

Reexamination Request:
No. 90/000,271, Oct. 8, 1982

Reexamination Certificate for:
Patent No.: 4,153,469
Issued: May 8, 1979
Appl. No.: 873,063
Filed: Jan. 27, 1978

Disclaimer of Claim(s) filed May 18, 1983 (1034 O.G. 8)

Related U.S. Application Data

[63] Continuation of Ser. No. 782,445, Mar. 29, 1977, abandoned, which is a continuation of Ser. No. 391,055, Dec. 27, 1972, abandoned.

[51] Int. Cl.$^3$ .................. C04B 35/48; B01J 17/00; C01F 17/00; C01G 27/02
[52] U.S. Cl. .................. 501/86; 23/293 R; 23/305 RE
[58] Field of Search .................................... 501/86

[56] References Cited
U.S. PATENT DOCUMENTS 1,658,659  2/1928  Skaupy et al.
3,259,585  7/1966  Fitch et al.
3,535,481  10/1970  Korb.
3,634,113  1/1972  Fehrenbacker.
3,824,302  7/1974  Alexandrov et al.

OTHER PUBLICATIONS

"Oxide Ceramics" by E. Rysbheswitch (1960), Academic Press, pp. 357, 365-367, 369 & 381.
"Encyclopedia of Chemical Technology" by Kirk-Othmer (1963), vol. 10, p. 766 and vol. 22, pp, 652-653.
"Rev. Int. Hautes Temper. et Refract." No. 3 (1969), article by Yves Roulin et al. on pp. 153-158 together with English translation.
"Gems Made by Man" by Kurt Nassau (1980), Chilton Book Company, pp. 232-241 and back flap of book jacket.
Lawson et al., *Preparation of Single Crystals*, pp. 14-16, Butterworths Scientific Publications, London, 1958.

*Primary Examiner*—Mark Bell

[57] ABSTRACT

Monocrystals based on zirconium or hafnium dioxide stabilized with yttrium oxide having the following proportions of the said elements (in mol. %)
zirconium or hafnium dioxide: 70-90
yttrium oxide: 30-10.

Said monocrystals may also contain oxides of the transition or the rare-earth elements or their mixtures in an amount of from 0.01 to 5% of the weight of the monocrystal.

The method of producing the monocrystals consists in the preparation of a charge of zirconium or hafnium dioxide and yttrium oxide, melting of the charge, and growing the monocrystals from the obtained melt in the open air by the Stockbarger process.

The obtained monocrystals obtained are transparent, colorless, have a high optical quality (a refractive index of $n=2-2.2$; a transmission band of 2,000-74,000 A), a microhardness of 1,300 to 1,500 kg/mm$^2$, a dislocation density of $10^3$ to $10^5$ cm$^{-2}$, and with various dimensions (a height of 1 to 8 cm, and a cross section of 0.5 to 4 cm$^2$).

In order to obtain colored monocrystals, oxides of transition or rare-earth elements are added either to the charge during its preparation or to the melt.

The monocrystals obtained can be used as artificial precious stones in jewelry, in the optical industry, or as laser elements in quantum electronics.

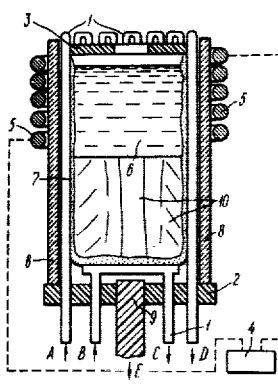

REEXAMINATION CERTIFICATE ISSUED UNDER 35 U.S.C. 307.

THE PATENT IS HEREBY AMENDED AS INDICATED BELOW.

AS A RESULT OF REEXAMINATION, IT HAS BEEN DETERMINED THAT:

Claims 1-12 are now disclaimed and dedicated.

* * * * *